United States Patent
Rector et al.

(10) Patent No.: US 10,317,284 B2
(45) Date of Patent: Jun. 11, 2019

(54) SYSTEMS AND METHODS FOR TESTING AND CHARACTERIZING LED LIGHTING DEVICES

(71) Applicant: Hubbell Incorporated, Shelton, CT (US)

(72) Inventors: David John Rector, Mauldin, SC (US); T. Warren Weeks, Jr., Simpsonville, SC (US)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 15/110,273

(22) PCT Filed: Jan. 7, 2015

(86) PCT No.: PCT/US2015/010448
§ 371 (c)(1),
(2) Date: Jul. 7, 2016

(87) PCT Pub. No.: WO2015/105853
PCT Pub. Date: Jul. 16, 2015

(65) Prior Publication Data
US 2016/0334278 A1  Nov. 17, 2016

Related U.S. Application Data

(60) Provisional application No. 61/925,138, filed on Jan. 8, 2014.

(51) Int. Cl.
*G01J 3/50* (2006.01)
*G01J 3/46* (2006.01)
(Continued)

(52) U.S. Cl.
CPC .............. *G01J 3/505* (2013.01); *G01J 3/465* (2013.01); *H01L 25/00* (2013.01); *G01J 2001/4247* (2013.01); *G01J 2001/4252* (2013.01)

(58) Field of Classification Search
CPC .... G01J 1/32; G01J 3/505; G01J 3/465; G01J 2001/4247; G01J 2001/4245;
(Continued)

(56) References Cited

U.S. PATENT DOCUMENTS 7,682,850 B2   3/2010  Harbers et al.
8,624,527 B1*  1/2014  Meir .................... H05B 33/086
                                              315/149
(Continued)

FOREIGN PATENT DOCUMENTS

CN   102155650     8/2011
CN   102541950 A   7/2012
(Continued)

OTHER PUBLICATIONS

PCT/US2015/010448 International Search Report and Written Opinion dated Jul. 5, 2015 (14 pages).
(Continued)

*Primary Examiner* — Jamil Ahmed
(74) *Attorney, Agent, or Firm* — Michael Best & Friedrich, LLP

(57) ABSTRACT

Systems and methods for characterizing solid state lighting devices are provided. In certain examples, systems and methods for measuring various parameters of light emitting diodes (LEDs), characterizing each LED based on the measured parameters and selecting one or more of the characterized LEDs such that the emitted light from each of the selected LEDs is mixed with the light from the other selected LEDs to create a desired overall light output are described.

18 Claims, 3 Drawing Sheets

(51) Int. Cl.
*H01L 25/00* (2006.01)
*G01J 1/42* (2006.01)

(58) Field of Classification Search
CPC ...... H05B 33/086; H05B 37/00; H05B 37/02; H01L 25/0753; G03B 21/26; G03B 21/14; G01B 21/18; G01B 21/00
See application file for complete search history.

(56) References Cited

U.S. PATENT DOCUMENTS

| | | | | |
|---|---|---|---|---|
| 2007/0103646 | A1* | 5/2007 | Young | G01J 1/32 353/52 |
| 2010/0320928 | A1* | 12/2010 | Kaihotsu | H01L 25/0753 315/250 |
| 2011/0163683 | A1 | 7/2011 | Steele et al. | |
| 2013/0134446 | A1 | 5/2013 | Wang | |

FOREIGN PATENT DOCUMENTS

| | | |
|---|---|---|
| CN | 102541951 A | 7/2012 |
| CN | 102548112 A | 7/2012 |
| CN | 102573221 | 7/2012 |
| CN | 103354076 | 10/2013 |
| CN | 103486466 | 1/2014 |
| JP | 200780530 | 3/2007 |
| JP | 2007273998 | 10/2007 |
| JP | 2011503822 | 1/2011 |
| JP | 2011515819 | 5/2011 |
| JP | 2012186277 | 9/2012 |
| JP | 201326237 | 2/2013 |

OTHER PUBLICATIONS

Jeffrey Singer et al., Testing high brightness LEDs relative to application environment, Proceedings of Spie, vol. 6337, Aug. 29, 2006 (8 pages).
Second Office Action issued by the State Intellectual Property Office of China for Chinese Patent Appl. No. 201580007928.5 and translation (14 pages).
European Patent Application No. 15701865.6 Examination Report dated Jun. 4, 2018 (8 pages).
Third Office Action issued by the State Intellectual Property Office of China for Chinese Patent Appl. No. 201580007928.5 and translation dated Apr. 27, 2018 (10 pages).
Japanese Patent Application No. 2016-545324 Official Action dated Oct. 5, 2018 (7 pages).

* cited by examiner

SYSTEMS AND METHODS FOR TESTING AND CHARACTERIZING LED LIGHTING DEVICES

CLAIM TO PRIORITY

This application is based on U.S. Provisional Application Ser. No. 61/925,138, filed Jan. 8, 2014, the disclosure of which is incorporated herein by reference in its entirety and to which priority is claimed.

FIELD

Various exemplary embodiments relate generally to methods and devices for characterizing solid state lighting devices. More particularly, in certain embodiments, the present application is directed to a method and device for measuring various parameters of light emitting diodes (LEDs), characterizing each LED based on the measured parameters and selecting one or more of the characterized LEDs such that the emitted light from each of the selected LEDs is mixed with the light from the other selected LEDs to create a desired overall light output.

BACKGROUND

Due to recent technological advances in their production processes and their inherent low-cost and energy-efficient nature, LEDs are rapidly becoming one of the most, if not the most, popular light sources for illumination purposes. Additionally, because LEDs are semiconductor devices, they are much more resilient and damage resistant than the currently popular incandescent light bulbs and fluorescent tubes.

In view of these beneficial attributes of LEDs, many manufacturers of lighting equipment are focusing their efforts on providing lighting devices, e.g., luminaires, etc., that incorporate LED light sources instead of incandescent or compact fluorescent light sources.

An LED is a semiconductor device that produces light when electric current is passed through it in a particular direction. The light is produced due to a conversion of energy that occurs within the specific semiconductor material used to fabricate the particular LED. Research conducted over the last few decades has resulted in the ability to produce LEDs that emit a wide spectrum of monochromatic colors including basic Red, Blue and Green, as well as a myriad of colors in-between these basic three colors.

There are many significant benefits to working with LEDs; energy conservation is one of the most widely known. A direct comparison of LEDs to the other prevailing lighting technologies, such as incandescent and fluorescent, indicates the energy savings that can be realized. Specifically, incandescent light sources use the most energy, fluorescent light sources use the second most, and LEDs use the least amount of energy and, thus, are the most energy-efficient of the three.

As mentioned, unlike incandescent and fluorescent light sources, LEDs can emit light of many monochromatic colors and are not limited to white light or the various shades of white. That is, depending on the particular semiconductor material used, as well as several other factors, including the manufacturing process used, the particular packaging, and others, LEDs typically emit light in a narrow band of colors, wavelengths. For example, Table 1 below provides the band of wavelengths associated with the seven recognized colors of the rainbow.

TABLE 1

| The Visible Light Spectrum | |
| --- | --- |
| Color | Wavelength (nm) |
| Red | 625-740 |
| Orange | 590-625 |
| Yellow | 565-590 |
| Green | 520-565 |
| Cyan | 500-520 |
| Blue | 435-500 |
| Violet | 380-435 |

"White LEDs" are often made with a blue "pump" LED and phosphors to down-convert the blue spectrum to visible white light. Based on present fabrication techniques, it is difficult to produce LEDs that emit a consistent band of wavelengths, i.e., at a specific color temperature, or that maintain the same light emission characteristics over time. This is one of the reasons it is often required to mix the light from two or more separate LEDs, such that the resulting band of wavelengths will have a dominant wavelength, or peak, at or near the desired wavelength at a desired correlated color temperature (CCT).

With respect to white light and/or the various shades of white, which are commonly used for illumination, the emitted band, or spectrum, of wavelengths emitted by an LED source is fairly broad. This is due to the inclusion of phosphor with different purities, particle sizes, and layer thicknesses that mix to produce white light.

Another known method for generating white light using LED light sources is to mix the respective light from three or more separate LED sources, for example Red, Green and Blue (RGB), or Red, Green, Blue and White (RGBW). To accommodate for the differences in the emitted light wavelength(s), LEDs are "binned" and packaged to balance the variations of the material and the manufacturing process with the needs of the lighting industry. Lighting-class LEDs are driven by application requirements and industry standards, including color consistency and color and lumen maintenance. Similar to the manner in which traditional incandescent and gas tube lamps are sold by brightness (e.g., as indicated by wattage) and color (warm or cool white), LEDs are binned for brightness (luminous flux) and color parameters (chromaticity).

Several performance requirements and standards for LED lighting applications have been established in the U.S. and elsewhere. The first of these standards was a 2007 industrial policy that mandated illumination technology for LED lamp requirements. This was the "ENERGY STAR® "Program Requirements for Solid State Lighting Luminaires." Several additional policies/standards were released subsequently and each of these documents includes requirements for CCT, color rendering index (CRI), lumen and color maintenance for an ENERGY-STAR-approved LED illumination products.

The "temperature" in the CCT measurement refers to black-body radiation, i.e., the light emitted by a solid object, such as metal, heated to the point of incandescence. The unit for CCT measurement is expressed in degrees K (Kelvin), a standard measurement of absolute temperature. Specifically, as a black-body gets hotter, the light it emits progresses through a sequence of colors, e.g., from red to orange to yellow to white to blue. The sequence of colors defines a curve within a color space. FIG. 1 shows the CIE 1931 color space, created by the International Commission on Illumination (CIE) to define the entire range of colors visible to the average viewer, with the black-body curve, also referred to as the Planckian locus, superimposed on it.

An incandescent lamp emits light with a color of roughly 2700 K which, as shown in FIG. 1, is toward the orange or reddish end of the scale. Because an incandescent bulb operates by heating a filament, which emits light when it reaches a certain temperature, the temperature of the filament is also the color temperature of the light.

Due to specialized testing equipment that measures the spectral component(s) of light, it is possible to define color temperatures for non-incandescent white light sources, such as fluorescent tubes and LEDs. However, because LEDs are semiconductor devices and do not operate by heating a metal filament, the actual temperature of an LED source is much lower than an incandescent bulb emitting the same color temperature of light. For example, an LED emitting light measured to be 2700 K may actually only heat up to around 80° C.

The American National Standards Institute (ANSI) issued a standard for the color of light waves emitted from LED light sources. Specifically, chromaticity standard C78.377A, published in 2008, defines eight nominal CCTs that range from 2700 K (referred to as "warm" light) to 6500 K ("daylight").

Referring to FIG. 2, each of the eight nominal CCTs is represented by a quadrilateral the interior of which defines the allowable variations both along and perpendicular to the Planckian locus, or black-body curve. The respective allowable variations corresponding to each nominal CCT are specified in the ANSI standard (i.e., ANSI C78.377A).

As can be seen by viewing the quadrilaterals in FIG. 2 and referring back to FIG. 1 as well, variations that lie along the black-body curve make a light source appear more reddish as the X chromaticity value increases, when the change is toward the right of the black-body curve, or more bluish as X decreases, i.e., when the change is toward the left of the black-body curve. Variations above and below the black-body curve make a light source appear more greenish as the Y value increases, or pinkish as the Y value decreases.

Variations along the black-body curve are measured in degrees K, while variations perpendicular to the black-body curve are notated as Duv. Duv ranges are defined on the CIE 1976 color space, rather than the 1931 color space, because the 1976 color space (also known as the CIELUV color space) is better suited for evaluating color differences of light sources because it uses a uniform scale in which a distance measured anywhere on the color space represents the same degree of difference in color.

The axes of the CIE 1976 color space are u' and v', instead of x and y. Duv measures the distance from the black-body curve, and therefore the degree of color change. Positive Duv values are above the curve, while negative Duv values are below the curve.

Table 2 below provides the allowable variations in CCT value, i.e., along the black-body curve, and the allowable variations in Duv value, i.e., perpendicular to the black-body curve, for each of the eight nominal CCT values, according to ANSI C78.377A). For example, as shown, the 4500 K quadrilateral covers CCT values, or temperatures, ranging from 4260 K to 4746 K along the black-body curve. Additionally, the 4500 K quadrilateral extends up to 0.007 above the curve to 0.005 below the curve.

TABLE 2

| Nominal CCT (ANSI C78.377A) | | |
| --- | --- | --- |
| CCT | CCT Range | $D_{uv}$ Range |
| 2700 K | 2725 K ± 145 | 0.000 ± 0.006 |
| 3000 K | 3045 K ± 175 | 0.000 ± 0.006 |
| 3500 K | 3465 K ± 245 | 0.000 ± 0.006 |
| 4000 K | 3985 K ± 275 | 0.001 ± 0.006 |
| 4500 K | 4503 K ± 243 | 0.001 ± 0.006 |
| 5000 K | 5028 K ± 283 | 0.002 ± 0.006 |
| 5700 K | 5665 K ± 355 | 0.002 ± 0.006 |
| 6500 K | 6530 K ± 510 | 0.003 ± 0.006 |

In view of the specific issues related to LED lighting and, in particular, illumination using LED sources, it is desired to provide a method and an associated device that provides for accurate and cost-effective grouping of separate LED sources in order to achieve a specific desired light output effect. For example, as explained in more detail below, because currently available individual LED devices do not all emit consistent white light that is ideal for illumination applications and, thus, two or more LED sources are typically mixed to achieve the desired color of light emission, a method of accurately selecting individual LEDs that will combine to most closely achieve that color is desired.

Further, because there are relatively wide variances in color CCT value) and sometimes noticeable variations in luminous flux from one LED to the next, even between LEDs produced from the same semiconductor wafer, LED manufacturers charge a premium for offering groupings of LEDs that have been tested and grouped into "bins" such that all of the LEDs within a given bin are known to have a color value within a particular range and a flux within a particular range. The smaller the range in these parameters leads to a correspondingly higher premium charged by the LED manufacturer. Accordingly, it is further desired to provide a method and device that enables a lighting device designer or manufacturer that purchases LEDs from LED manufacturers to avoid or minimize the premiums charged for tightly specified LEDs.

SUMMARY

In consideration of the issues and desires associated with current methods for measuring and characterizing LED devices to be incorporated within a variety of lighting devices, including but not limited to the issues and desires discussed above, a device and method for measuring and characterizing individual LEDs and grouping together a number of the characterized devices in a defined manner to provide a desired color and brightness of light has been proposed.

According to one aspect of the application a device and method in accordance with one or more exemplary embodiments includes measuring one or more of several relevant parameters of an LED device, for example, an LED selected from a batch of several LED devices, regardless of whether the LEDs belong to a so-called "bin" as defined by the LED manufacturer or not, and storing the measured data corresponding to each LED in a manner that facilitates rapid selection of one or more individual LED devices from a collection of LED devices.

According to a second aspect of one or more exemplary embodiments of the application, two or more individual LED devices are grouped together based on their respective stored data to provide a desired overall light output from a specified lamp, e.g., in regard to color and luminous flux, when the lamp is activated. According to one or more exemplary embodiment, an algorithm is employed that incorporates one or more of, the number of individual LEDs to be incorporated into the lamp, the temperature of the LED device under drive conditions, the drive current of the LED and the pitch of the lamp.

According to a third aspect of one or more exemplary embodiments of the application, LEDs to be incorporated into lighting devices are selected from "bins" that substantially depart from the Planckian locus, or black-body, curve or are selected from a plurality of LEDs that were not binned at all. For example, instead of selecting LED-devices to be used in a given lamp that are selected from bins that reside within a one- or two-step Macadam ellipse from the Planckian locus, as is the practice with respect to most related-art LED characterization systems, in accordance with this aspect of the application, LEDs are selected from bins that are three, four, or more, steps from the ideal black-body curve.

BRIEF DESCRIPTION OF THE DRAWINGS

Exemplary embodiments of the disclosed invention are described in detail below by way of example, with reference to the accompanying drawings, in which.

DETAILED DESCRIPTION OF EXEMPLARY EMBODIMENTS

Figure 1:
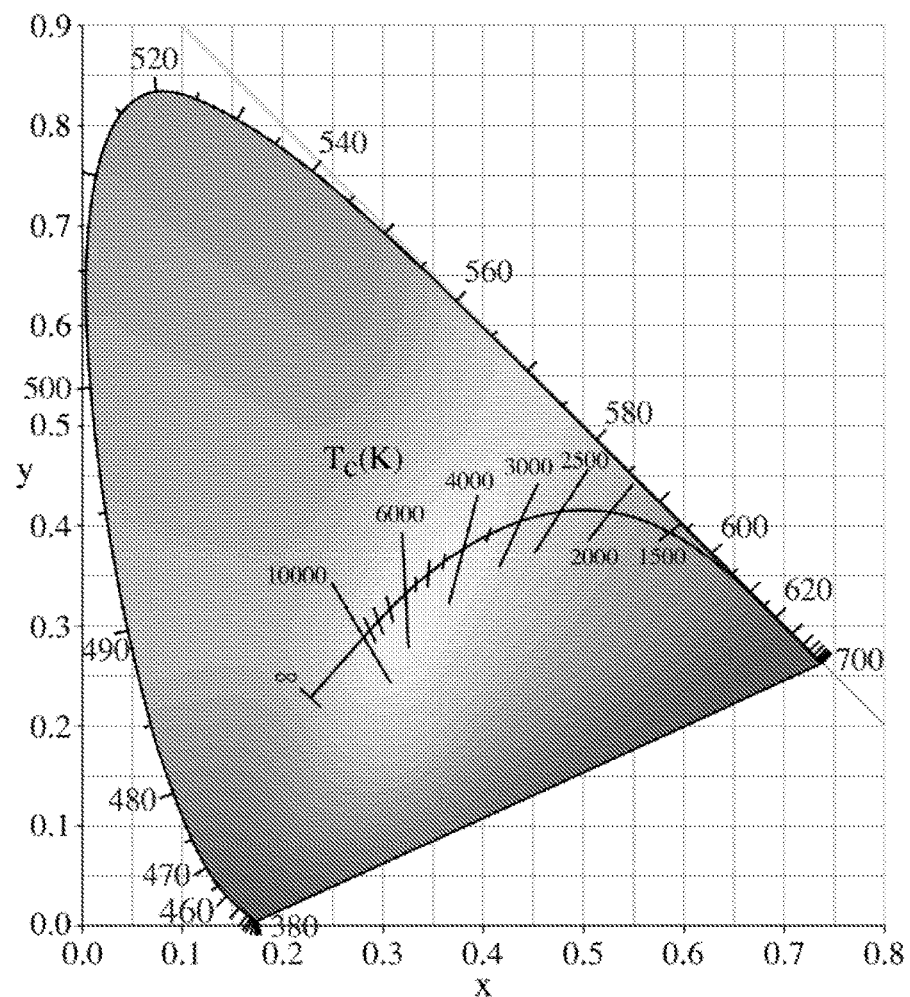
FIG. 1 is a reproduction of the known CIE 1931 chromaticity diagram with the Planckian locus superimposed thereon.
Figure 2:
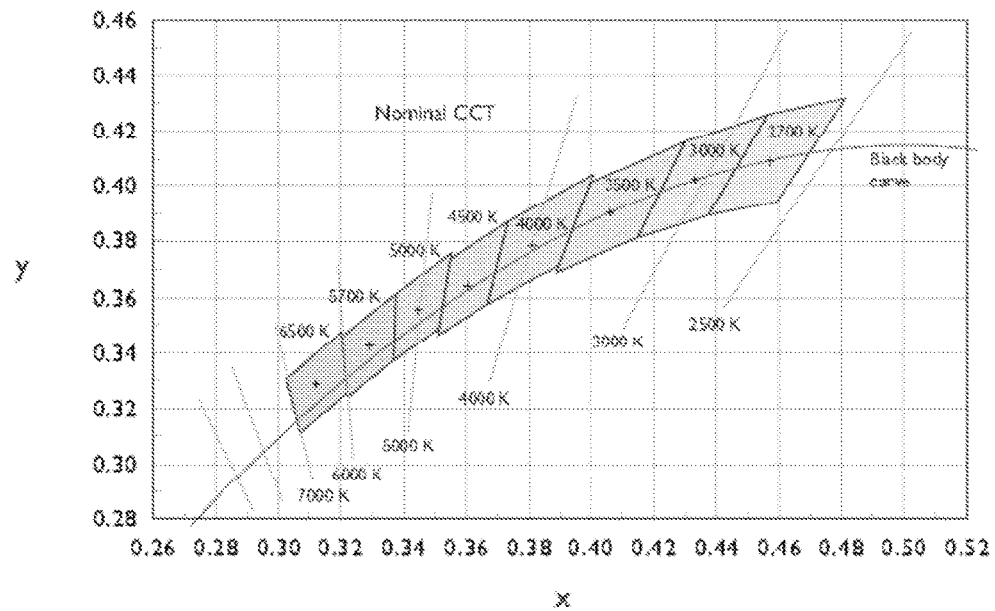
FIG. 2 is a diagram showing the known eight nominal CCT's and their respective ranges as defined by the ANSI C78.377A standard.

Exemplary embodiments of devices and methods consistent with the present application include one or more of the novel aspects described in detail below. For example, one or more exemplary embodiment of the application disclosed includes a method and device in which individual LEDs are tested under practical operating conditions and various technical parameters associated with each tested LED are stored, for example, in a computer memory device. Moreover, in an alternative, one or more LEDs are each tested under more than one practical operating scenario, with resulting characteristic data stored for each. For example, the production facility may manufacture 10 different luminaires. In such a case, the LEDs may be tested using practical operating parameters associated with more than one of the different luminaires.

Alternatively, the LEDs may be tested using at least two different practical operating scenario profiles, wherein each profile is appropriate for use with one or more of the luminaires. In yet another alternative, the LED testing system may "physically" store the LED test data by physically storing the LED in a uniquely identified storage location that is associated with the test data. In certain illustrative embodiments, the systems and methods described herein may be realized by modifying existing commercial LED test systems such as the Model 58267 available from Chroma ATE of California, the LED Tester available from Instrument Systems of Munich, Germany, and/or the HP6000 or HP8000 available from Hopu Optics Technology Co., Ltd. of China along with associated computer and material handling devices including computers such as DELL POWEREDGE Servers available from Dell, Inc. of Texas.

According to another illustrative embodiment, each individual LED selected from a collection of LEDs is tested on an apparatus configured to measure various electrical or other lighting related parameters associated with the LED under certain predefined conditions. For example, a collection of LEDs from one or more predefined bins are procured from an LED manufacturer. Each bin is defined by the manufacturer based on parameters or parameter ranges, such as, color, luminous flux and forward voltage, of the LEDs specified for that bin. Each LED is assigned or already included unique identifying data, for example a unique part or serial number. According to an exemplary embodiment each LED is tested under one or more specific operating or drive conditions and one or more parameters are measured. The measured parameters include one or more of, specific color, luminous flux, wavelength, spectral power distribution, and forward voltage of the LED, each of which are measured and stored for the tested LED.

The specific operating conditions under which the procured LEDs are tested are defined by one or more of, the particular luminaire into which the LED is to be installed, the total number of LEDs to be installed in that luminaire, the drive temperature of the LEDs under load conditions, e.g., typically a value between 60° C. and too. C, the drive current the particular LED will experience when operated in the luminaire, e.g., typically a value between 25 mA and 2000 mA per LED, the pitch associated with the LEDs for the particular luminaire, e.g., the distance between adjacent LEDs, and other relevant parameters that are known to affect the emitted light or longevity of the LED.

Relevant data, including an identifier for the particular LED, such as a serial number, emitted color, luminous flux, forward voltage and the operating conditions under which the LED was tested, are stored in a memory device, such as a computer memory, and made available for future access. As described in detail below, based on the stored data, a number of specific LEDs are later selected from the tested LEDs to achieve a predefined lighting result.

Figure 3:
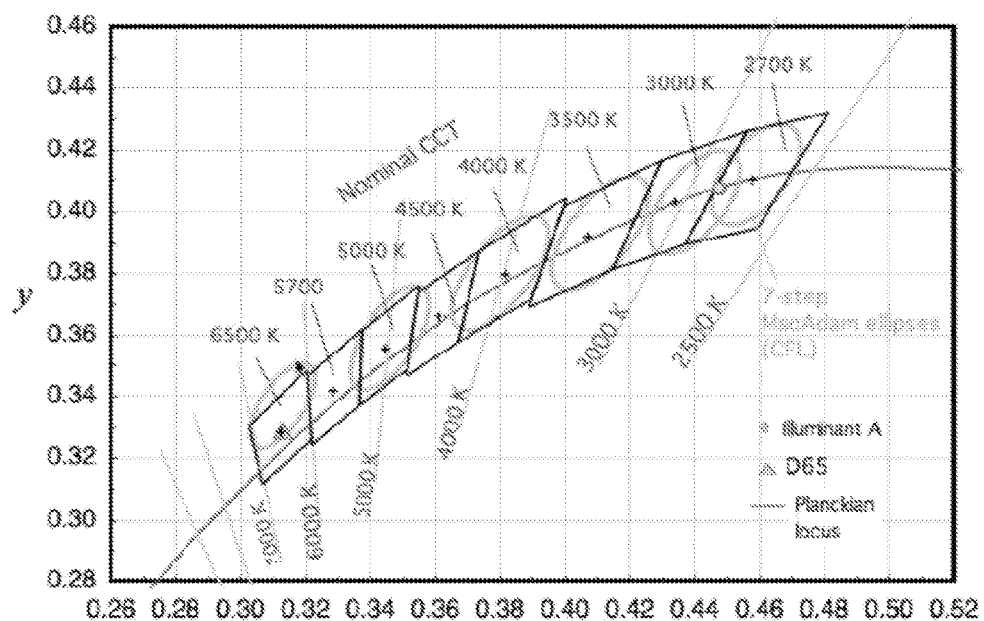
FIG. 3 is a diagram showing each of the eight nominal CCTs provided in FIG. 2 with corresponding 7-step MacAdam ellipses provided for each nominal CCT.

As shown in FIG. 3, an ellipse, called a MacAdam ellipse, encompasses most of the allowable colors, or X, Y coordinates on the chromaticity diagram, for each of the eight nominal CCTs. A "one-step" MacAdam ellipse for a particular X, Y color point is defined to encompass one standard deviation of a "standard observer." That is, approximately 65% of humans perceive a given color, i.e., as defined by its X, Y coordinates, as some point within a one-step MacAdam ellipse centered on those X, Y coordinates. Larger ellipses are defined to enclose two, three or more standard deviations allowing a higher percentage of observers, 95% to 99%, to perceive the same color as a point somewhere within the ellipse.

In other words, the size of the MacAdam ellipse for any particular color, or CCT coordinate, is based on standard variance, called "steps." As mentioned, a one-step MacAdam ellipse is one in which every point of the circumference, or outer boundary, of the ellipse is exactly one standard variance from the center point of the ellipse. Similarly, in a four-step MacAdam ellipse, each point on the circumference of the ellipse is exactly four standard variations from the center.

The MacAdam ellipses shown in FIG. 3 are 7-step ellipses, which the U.S. Department of Energy originally set as a standard for compact fluorescent (CFL) bulbs. The ANSI chromaticity specification was developed to be as consistent as possible with existing fluorescent lamp standards, and to reflect the current and near future state of solid-state lighting (SSL) technology and color binning capabilities. ANSI recommends that lamp manufacturers design their lamps to reside within a four-step ellipse for a given specified color, i.e., CCT.

Figure 4A:
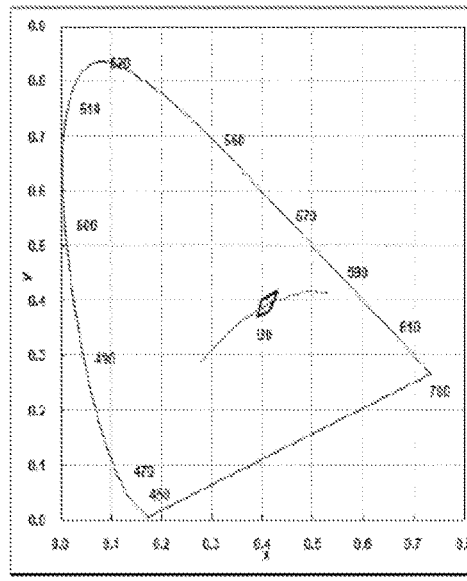
FIG. 4A is a revised version of the chromaticity diagram provided in FIG. 1 with a quadrilateral superimposed on the black-body curve identifying a desired color range in accordance with an exemplary embodiment of the present application.

FIG. 4A is a modified copy of the CIE 1931 chromaticity diagram discussed above. As shown, a particular quadrilateral (U0) is identified on the Planckian locus within which the desired color resides for a particular lighting application according to an embodiment of the application. In this simplified example, it is desired to mix two LEDs from a particular lot of eight (8) LEDs to achieve the desired color.

Figure 4B:
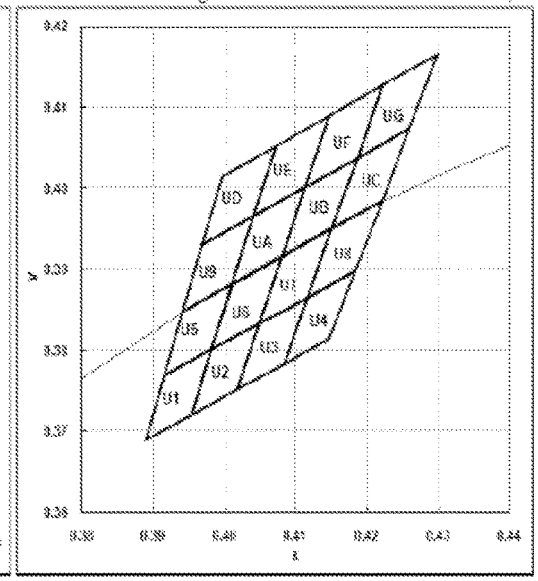
FIG. 4B is a close-up view of the quadrilateral shown in FIG. 4A broken into sixteen sub-quadrilaterals in accordance with an exemplary embodiment of the present application.

FIG. 4B is a close-up of the quadrilateral identified in FIG. 4A. In this example, quadrilateral U0 from FIG. 4A has been further divided into sixteen (16) smaller quadrilaterals, U1-U8 below the Planekian locus and U9-UG above the Planckian locus. Dividing the larger quadrilateral shown in FIG. 4A into smaller sections, or bins, is a technique referred to as "binning" and is clone to ensure a desired color by specifying tighter tolerances when purchasing LEDs from the LED manufacturer.

Specifically, LEDs exhibit greater variability than other light sources, such as tungsten or halogen. Thus, LED manufacturers typically either develop or adopt binning techniques to offer consistent characterization of their offered LEDs. That is, even though LEDs, particularly white LEDs, are manufactured with adherence to very tight tolerances at every step of the process, including semiconductor wafer production through component packaging and drive circuitry, there are natural variations in material and processes that dictate the photometric response. For example, material characteristics vary over the surface of a wafer and these variances carry into the individual LED die. Binning techniques characterize the output of manufacturing processes and enable customers, such as lamp designers and/or manufacturers, to develop strategies to work with this output and achieve uniform illumination sources. Purchasing LEDs that adhere to tighter tolerances comes at a price, however. Specifically, LED manufacturers invariably charge a premium for LEDs that have been binned to a set of tightly defined tolerances.

According to the present exemplary embodiment, referring to FIG. 4B, at any point along the Planckian locus for the given desired color, i.e., 3465 K±245 K, there are eight sub-quadrilaterals above the Planckian locus and eight sub-quadrilaterals below the Planckian locus. Thus, clue to the additive nature of the light emitted from an LED, to achieve an ultimate X, Y coordinate as close to the Planckian locus as possible and, further, assuming that no known single LED emits light with an X, Y coordinate that resides directly on the Planckian locus for the desired color, one skilled in the art would know that ideally one or more LEDs specified above the locus and one or more LEDs specified below the Planckian locus should be mixed to achieve a color directly on the locus line.

In accordance with the present example of the application, LEDs from quadrilaterals UA and U7 were specified and, thus, the eight LEDs from which the two LEDs will be selected have X, Y coordinates within either quadrilateral UA or quadrilateral U7. Each of the eight LEDs were tested under practical drive conditions and their respective X, Y coordinates and emitted flux were stored along with the specific drive conditions, e.g., the number of individual LEDs to be incorporated into the lamp, the temperature of the LED device under drive conditions, the drive current of the LED and the pitch of the lamp. The number of LEDs incorporated into the lamp can include the total number of LEDs used in a luminaire or a group of LEDs used in a luminaire that includes multiple groups of LEDs with each group forming a lamp.

In another alternative, a luminaire is also specified with an LED pitch or spacing. In this example, a first luminaire has a 1 inch pitch and color mixing will happen sooner. In another luminaire, the LED PCB board has a pitch or LED spacing of 3 inches and mixing is over a longer distance. In this alternative, or in any of the others as appropriate, multiple mix scenarios for the batch of LEDS are calculated. Here, LEDs that are closer in color are used for luminaires that have the largest pitch as the color mixing is over a longer distance. Similarly, the LEDs that are farther apart in color are used together in a luminaire with the smallest pitch. In yet another alternative, a luminaire is characterized by having spatial zones on a PCB board such as 8 LEDs around a circle and the mixing is performed with sub-mixing in 4 sets of opposing pairs.

Table 3 below provides the measured values for each of a lot of eight different LEDs, LD1 through LD8, which were selected from either UA or U7;

TABLE 3

| LED # | X | Y | Flux |
|---|---|---|---|
| LD1 | 0.401 | 0.3882 | 27 |
| LD2 | 0.408 | 0.3916 | 27 |
| LD3 | 0.4113 | 0.4001 | 27 |
| LD4 | 0.404 | 0.3966 | 27 |
| LD5 | 0.4048 | 0.3932 | 27 |
| LD6 | 0.4116 | 0.3865 | 27 |
| LD7 | 0.415 | 0.395 | 27 |
| LD8 | 0.408 | 0.3916 | 27 |

The "X" column in Table 3 specifies the X coordinate for the given LED, the "Y" column specifies the Y CCT coordinate and the "Flux" column specifies the measured luminous flux for each of the given eight LEDs. The objective, therefore, in accordance with this example, is to select two LEDs from LD1 through LD8 such that the resulting light is as close to 3465 K as possible.

One skilled in the art would know that there are several methods for calculating the resulting X, Y CCT coordinates for a mix of LEDs and utilizing a different method than the simplified method used here would not depart from the spirit and scope of the invention disclosed. For example, the X, Y coordinates can be calculated using the tristimulus method. A simplified method has been chosen here for ease of explanation. More accurate and comprehensive methods for calculating the resulting X, Y chromaticity coordinates, e.g., using programmed computation devices, are fully contemplated by the inventors and would be used in most practical situations.

The mixed light from two or more LEDs is calculated in accordance with the present embodiment of the application according to equation 1 (EQN 1) below:

$$\text{Smart Mixing}^{tm} \overline{X}_w = \frac{\sum_1^n X_i W_i}{\sum_1^n W_i}, \overline{Y}_w = \frac{\sum_1^n Y_i W_i}{\sum_1^n W_i} \quad \text{(EQN 1)}$$

Where $X_i$ and $Y_i$ represent the X and Y chromaticity coordinates and $W_i$ represents the corresponding flux.

Table 4 below provides the calculated X, Y CCT coordinates that result when each of the eight LEDs, LD1-LD8 is combined with each of the other seven LEDs. For example, using equation 1 (EQN 1) above, when the light from LD1 is combined, or mixed, with the light emitted from LD2, the resulting X, Y chromaticity coordinates are 0.4045, 0.3899, respectively.

TABLE 4

| LD1/LDn | | LD2/LDn | | LD3/LDn | | LD4/LDn | |
|---|---|---|---|---|---|---|---|
| X | Y | X | Y | X | Y | X | Y |
| NA | NA | 0.4045 | 0.3899 | 0.4062 | 0.3942 | 0.4025 | 0.3924 |
| 0.4045 | 0.3899 | NA | NA | 0.4097 | 0.3959 | 0.4060 | 0.3941 |
| 0.4062 | 0.3942 | 0.4097 | 0.3959 | NA | NA | 0.4077 | 0.3984 |
| 0.4025 | 0.3924 | 0.4060 | 0.3941 | 0.4077 | 0.3984 | NA | NA |
| 0.4029 | 0.3907 | 0.4064 | 0.3924 | 0.4081 | 0.3967 | 0.4044 | 0.3949 |
| 0.4063 | 0.3874 | 0.4098 | 0.3891 | 0.4115 | 0.3933 | 0.4078 | 0.3916 |
| 0.4080 | 0.3916 | 0.4115 | 0.3933 | 0.4132 | 0.3976 | 0.4095 | 0.3958 |
| 0.4045 | 0.3899 | 0.4080 | 0.3916 | 0.4097 | 0.3959 | 0.4060 | 0.3941 |

| LD5/LDn | | LD6/LDn | | LD7/LDn | | LD8/LDn | |
|---|---|---|---|---|---|---|---|
| X | Y | X | Y | X | Y | X | Y |
| 0.4029 | 0.3907 | 0.4063 | 0.3874 | 0.4080 | 0.3916 | 0.4045 | 0.3899 |
| 0.4064 | 0.3924 | 0.4098 | 0.3891 | 0.4115 | 0.3933 | 0.4080 | 0.3916 |
| 0.4081 | 0.3967 | 0.4115 | 0.3933 | 0.4132 | 0.3976 | 0.4097 | 0.3959 |
| 0.4044 | 0.3949 | 0.4078 | 0.3916 | 0.4095 | 0.3958 | 0.4060 | 0.3941 |
| NA | NA | 0.4082 | 0.3899 | 0.4099 | 0.3941 | 0.4064 | 0.3924 |
| 0.4082 | 0.3899 | NA | NA | 0.4133 | 0.3908 | 0.4098 | 0.3891 |
| 0.4099 | 0.3941 | 0.4133 | 0.3908 | NA | NA | 0.4115 | 0.3933 |
| 0.4064 | 0.3924 | 0.4098 | 0.3891 | 0.4115 | 0.3933 | NA | NA |

To convert the calculated X, Y coordinates from Table 4 into a corresponding approximate CCT value, equation 2 (EQN 2) below, known as McCamy's formula, is used:

$$CCT = 449n^3 + 3525n^2 + 6823.3n + 5520.33 \quad (EQN\ 2)$$

where $n = (x - 0.3320)/(0.1858 - y)$

McCamy's formula is used in accordance with this example, i.e., where the target CCT is 3465 K, because it is known to provide a maximum absolute error of less than 2 degrees Kelvin for color temperatures ranging from 2,856 to 6,500 K. If a more accurate solution is required one having ordinary skill in the art would know of alternative conversion methods that can be used.

Table 5 below provides the corresponding values of n and approximate CCT as calculated by EQN 2 above:

TABLE 5

| n | Approx CCT | n | Approx CCT | n | Approx CCT | n | Approx CCT |
|---|---|---|---|---|---|---|---|
| NA | NA | 0.3552 | 3521.2 | 0.3559 | 3518.2 | 0.3412 | 3584.6 |
| 0.3552 | 3521.2 | NA | NA | 0.3697 | 3457 | 0.3553 | 3521.1 |
| 0.3559 | 3518.2 | 0.3697 | 3457 | NA | NA | 0.3559 | 3518.1 |
| 0.3412 | 3584.6 | 0.3553 | 3521.1 | 0.3559 | 3518.1 | NA | NA |
| 0.346 | 3562.8 | 0.3601 | 3499.3 | 0.3607 | 3496.8 | 0.3462 | 3561.8 |
| 0.3686 | 3461.5 | 0.3828 | 3399.8 | 0.3829 | 3399.3 | 0.3684 | 3462.5 |
| 0.3693 | 3458.7 | 0.3831 | 3398.3 | 0.3832 | 3397.8 | 0.369 | 3459.7 |
| 0.3552 | 3521.2 | 0.3693 | 3458.7 | 0.3697 | 3457 | 0.3553 | 3521.1 |

| n | Approx CCT | n | Approx CCT | n | Approx CCT | n | Approx CCT |
|---|---|---|---|---|---|---|---|
| 0.346 | 3562.8 | 0.3686 | 3461.5 | 0.3693 | 3458.7 | 0.3552 | 3521.2 |
| 0.3601 | 3499.3 | 0.3828 | 3399.8 | 0.3831 | 3398.3 | 0.3693 | 3458.7 |
| 0.3607 | 3496.8 | 0.3829 | 3399.3 | 0.3832 | 3397.8 | 0.3697 | 3457 |
| 0.3462 | 3561.8 | 0.3684 | 3462.5 | 0.369 | 3459.7 | 0.3553 | 3521.1 |
| NA | NA | 0.3734 | 3440.5 | 0.374 | 3438.1 | 0.3601 | 3499.3 |
| 0.3734 | 3440.5 | NA | NA | 0.3967 | 3340.3 | 0.3828 | 3399.8 |
| 0.374 | 3438.1 | 0.3967 | 3340.3 | NA | NA | 0.3831 | 3398.3 |
| 0.3601 | 3499.3 | 0.3828 | 3399.8 | 0.3831 | 3398.3 | NA | NA |

Table 6 below provides the difference between the target CCT, i.e., 3465 K, and the calculated approximate CCT for the two combined LEDs:

TABLE 6

| LD1/LDn | LD2/LDn | LD3/LDn | LD4/LDn | LD5/LDn | LD6/LDn | LD7/LDn | LD8/LDn |
|---|---|---|---|---|---|---|---|
| NA | 56.23 | 53.208 | 119.58 | 97.767 | 3.4865 | 6.3393 | 56.23 |
| 56.23 | NA | 8.0267 | 56.056 | 34.315 | 65.189 | 66.713 | 6.3393 |
| 53.208 | 8.0267 | NA | 53.097 | 31.789 | 65.672 | 67.156 | 8.0267 |
| 119.58 | 56.056 | 53.097 | NA | 96.752 | 2.4516 | 5.2692 | 56.056 |
| 97.767 | 34.315 | 31.789 | 96.752 | NA | 24.55 | 26.922 | 34.315 |

TABLE 6-continued

| LD1/LDn | LD2/LDn | LD3/LDn | LD4/LDn | LD5/LDn | LD6/LDn | LD7/LDn | LD8/LDn |
|---|---|---|---|---|---|---|---|
| 3.4865 | 65.189 | 65.672 | 2.4516 | 24.55 | NA | 124.7 | 65.189 |
| 6.3393 | 66.713 | 67.156 | 5.2692 | 26.922 | 124.7 | NA | 66.713 |
| 56.23 | 6.3393 | 8.0267 | 56.056 | 34.315 | 65.189 | 66.713 | NA |

As shown in Table 6, according to the present example, the best combination of two LEDs selected from the original eight LEDs, LD1-LD8, for achieving a CCT value as close to 3465 K is the combination of LD4 and LD6. As indicated, this combination provides an approximate CCT value of 3462.5 K, which is less than 2.5 degrees K from the target.

The example disclosed above, i.e., selecting two LEDs from a lot of eight tested LEDs from bins close to the Planckian locus, is a simplified example and is provided for illustration purposes only. In accordance with the illustrative embodiment disclosed herein, dramatic benefit is attained when individual LEDs are selected from a large collection of previously tested LEDs, e.g., tens of thousands of LEDs where the bins from which the LEDs were obtained from the manufacturer are spread across large color variations and/or reside a substantial distance above and below the Planckian locus. In other words, the LEDs from which the selected LEDs are chosen are specified within a relatively high number, e.g., 4-, 5-, 6-, or higher, step MacAdam ellipse with respect to the ultimately desired color.

By testing and storing the corresponding data for each and every LED purchased from the LED manufacturer, in accordance with the method of the present application, a lighting device manufacturer is able to take advantage of cheaper prices for the LEDs. That is, by mixing two or more LEDs consistent with the example outlined above, or variants thereof, and potentially from a much larger population of LEDs with a wider variation of color and flux values, the lighting manufacturer is able to use LEDs from bins much farther away from the Planckian locus than was previously possible. Because the specific data corresponding to each LED, e.g., the CCT X, Y coordinates, flux, forward voltage, CRI, power distribution, etc. is stored along with the specific drive conditions to be used, e.g., current, voltage temperature, duty cycle (waveform), etc., the lighting manufacturer can more accurately attain a specific emitted color value by mixing LEDs from bins existing in 3-, 4- and 5-step, and possibly more, MacAdam ellipses, more accurately and more cost-effectively than was previously possible to achieve a tighter standard. Additionally, where the resulting desired characteristics of a luminaire are known, the stored data for a group of LEDs can used to determine how many luminaires can be made from the group. The method can therefore be used to analyze a group of LEDs and determine the best way to distribute the LEDs across multiple luminaires. For example, a group of LEDs can be measured and based on the resulting data can be used in a set of first luminaires having a first desired light output or a set of second luminaires having a second desired light output based on the maximum number of luminaires that can be created with the group of LEDs, or other cost considerations, for example the total number of LEDs required to create the desired output.

The foregoing detailed description of the certain exemplary embodiments has been provided for the purpose of explaining the principles of the invention and its practical application, thereby enabling others skilled in the art to understand the invention for various embodiments and with various modifications as are suited to the particular use contemplated. This description is not necessarily intended to be exhaustive or to limit the invention to the exemplary embodiments disclosed. Any of the embodiments and/or elements disclosed herein may be combined with one another to form various additional embodiments not specifically disclosed. Accordingly, additional embodiments are possible and are intended to be encompassed within this specification and the scope of the appended claims. The specification describes specific examples to accomplish a more general goal that may be accomplished in another way.

As used in this application, the terms "front," "rear," "upper," "lower," "upwardly," "downwardly," and other orientational descriptors are intended to facilitate the description of the exemplary embodiments of the present invention, and are not intended to limit the structure of the exemplary embodiments of the present invention to any particular position or orientation. Terms of degree, such as "substantially" or "approximately" are understood by those of ordinary skill to refer to reasonable ranges outside of the given value, for example, general tolerances associated with manufacturing, assembly, and use of the described embodiments.

What is claimed:

1. A method of measuring and storing LED data comprising:
    driving each of a plurality of LEDs with a first predefined drive condition, the plurality of LEDs having data identifying each LED;
    measuring one or more selected parameters of each LED when the LED is driven with the first drive condition; and
    storing the one or more measured parameters and the first drive condition corresponding to the data identifying each LED.

2. The method of claim 1, wherein
    at least one of the one or more measured parameters is selected from the group consisting of CCT, Duv, luminous flux, spectral power distribution, and forward voltage.

3. The method of claim 1, wherein
    the first drive condition includes one or more of LED temperature, drive current, forward voltage, or duty cycle and a total number of LEDs used.

4. The method of claim 1, further comprising:
    calculating a mixed output of two or more of the plurality of LEDs based on one or more of the stored measured parameters.

5. The method of claim 4, wherein
    the first drive condition is representative of a luminaire and at least a portion of the plurality of LEDs are positioned in the luminaire based on the calculated mixed output to achieve a desired light output of the luminaire.

6. The method of claim 1, further comprising:
    driving each of the plurality of LEDs with a predefined second drive condition;

measuring one or more selected parameters of each LED when the LED is driven with the second drive condition; and storing the one or more measured parameters and the second drive condition with the data identifying each LED.

7. A method of selecting two of more LEDs from a group of LEDs comprising:

accessing data including, one or more measured parameters of a plurality of LEDs;

calculating a mixed output of two or more of the plurality of LEDs based on one or more of the stored measured parameters; and selecting two or more LEDs from said plurality of LEDs for positioning into a luminaire based on the mixed output, wherein the data includes a drive condition that includes one or more of LED temperature, current, forward voltage, duty cycle and a total number of LEDs used in the luminaire.

8. The method of claim 7, wherein
at least one of the one or more measured parameters is selected from the group consisting of CCT, Duv, luminous flux, spectral power distribution, and forward voltage.

9. The method of claim 7, wherein
the data includes a first drive condition representing a first luminaire having a first light output and a second drive condition representing a second luminaire having a second light output, and the two or more LEDs are selected for use with one of the first and second luminaires based on how close the mixed output matches the first or second light output.

10. The method of claim 7, wherein
the mixed output is calculated using the equation $$\overline{X}_w = \frac{\sum_1^n X_i W_i}{\sum_1^n W_i}, \overline{Y}_w = \frac{\sum_1^n Y_i W_i}{\sum_1^n W_i}.$$

11. The method of claim 7, further comprising:
driving each of the plurality of LEDs with a drive condition;

measuring, one or more parameters of each LED when the LED is driven with the drive condition; and storing the one or more measured parameters and the drive condition.

12. The method of claim 11, wherein
the plurality of LEDs having data identifying each LED that is stored with the or more measure parameters and the drive condition.

13. A method of mixing the emitted light of two or more LEDs for a lighting product comprising:

driving each of a plurality of LEDs with a predefined drive condition;

measuring one or more selected parameters of each of the LEDs when the LED is driven with said drive condition;

storing said measured parameters and said drive condition;

selecting said two or more LEDs from said plurality of LEDs for positioning within a luminaire based on the stored measured parameters and the stored drive condition.

14. The method recited in claim 13, wherein
the selected parameters include a color value and a flux value and said drive condition includes one or more of a drive temperature, a drive current, and a number of LEDs used in the lighting product.

15. The method of claim 13, further comprising
calculating a mixed output of two or more of the plurality of LEDs based on one or more of the stored measured parameters and wherein selecting the two or more LEDs is based on the mixed output.

16. The method of claim 15, wherein
the drive condition corresponds to a typical drive arrangement for a known luminaire and at least a portion of the plurality of LEDs are positioned in the known luminaire based on the calculated mixed output to achieve a desired light output of the luminaire.

17. The method of claim 15, wherein
the plurality of LEDs have data identifying each individual LED and said data is stored with the one or more measured parameters and the drive condition, and the mixed output is calculated using a weighted average equation, $$\overline{X}_w = \frac{\sum_1^n X_i W_i}{\sum_1^n W_i}, \overline{Y}_w = \frac{\sum_1^n Y_i W_i}{\sum_1^n W_i}.$$

18. The method of claim 1, wherein the data identifying each LED comprises at least one of a unique part number and a serial number.

* * * * *